United States Patent [19]

Kawase

[11] Patent Number: 5,656,077
[45] Date of Patent: Aug. 12, 1997

[54] CRUCIBLE FOR PREPARING COMPOUND SEMICONDUCTOR CRYSTAL

[75] Inventor: Tomohiro Kawase, Hyogo, Japan

[73] Assignee: Sumitomo Electric Industries, Co., Ltd., Osaka, Japan

[21] Appl. No.: 503,702

[22] Filed: Jul. 18, 1995

Related U.S. Application Data

[62] Division of Ser. No. 400,925, Mar. 9, 1995, Pat. No. 5,584,929.

[30] Foreign Application Priority Data

Mar. 11, 1994 [JP] Japan .................. 6-040724

[51] Int. Cl.$^6$ .................................................. C30B 35/00
[52] U.S. Cl. .................. 117/200; 117/54; 117/900
[58] Field of Search .................. 117/11, 54, 64, 117/80, 81, 82, 83, 900, 200; 204/192.1; 252/62.36 A; 427/429, 430.1

[56] References Cited

U.S. PATENT DOCUMENTS

| 3,734,817 | 5/1973 | Bienert et al. ............... 118/500 |
| 3,928,096 | 12/1975 | Vergano et al. ............. 437/168 |
| 4,923,561 | 5/1990 | Chemans et al. ............ 117/83 |
| 4,999,082 | 3/1991 | Kremer et al. ............... 117/83 |
| 5,131,975 | 7/1992 | Bourret-Courchesne ....... 117/82 |

FOREIGN PATENT DOCUMENTS

| 0104741 | 4/1984 | European Pat. Off. . |
| 0222404 | 5/1987 | European Pat. Off. . |
| 0417843 | 3/1991 | European Pat. Off. . |
| 60-191094 | 9/1985 | Japan . |
| 62-176998 | 8/1987 | Japan . |
| 1290589 | 11/1989 | Japan . |
| 244798 | 10/1990 | Japan . |
| 3122097 | 5/1991 | Japan . |
| 463234 | 2/1992 | Japan . |
| 6239686 | 8/1994 | Japan . |

OTHER PUBLICATIONS

G. Ajithkumar et al., "A Crystal Growth System with modified pulling arrangement and temperature controller", 8056 Measurement Sci. & Tech. 5 (1994) Aug., No. 8, pp. 1018–1020.

*Primary Examiner*—Felisa Garrett
*Attorney, Agent, or Firm*—W. G. Fasse; W. F. Fasse

[57] ABSTRACT

A method of preparing a compound semiconductor crystal in a crucible involves first forming a boron or boron compound containing layer on an inner surface of the crucible and heat treating the same to form a $B_2O_3$ containing layer. The resulting preheated crucible is then employed for preparing the compound semiconductor crystal. By pretreating the crucible in this manner, it is possible to previously form a homogenous $B_2O_3$ film on the crucible interior surface while preventing incomplete and heterogeneous coating of the $B_2O_3$ film. Consequently, it is possible to prevent a raw material melt from wetting the crucible interior surface and thus to suppress polycrystallization, thereby preparing a compound semiconductor single crystal with an excellent yield.

20 Claims, 5 Drawing Sheets

CRUCIBLE FOR PREPARING COMPOUND SEMICONDUCTOR CRYSTAL

CROSS-REFERENCE TO RELATED APPLICATIONS

This is a DIVISIONAL of U.S. patent application Ser. No. 08/400,925, filed Mar. 9, 1995, now allowed as U.S. Pat. No. 5,584,929. Furthermore, this application is related to copending and commonly assigned U.S. patent application Ser. No. 08/653,466, filed on May 24, 1996.

BACKGROUND OF THE INVENTION

1. Field of the Invention

The present invention relates to a method of and a crucible for preparing a compound semiconductor crystal, and more particularly, it relates to a method of and an apparatus for preparing a compound semiconductor crystal such as a group III-V compound semiconductor crystal of GaAs, GaP, GaSb, InP, InAs or InSb, or a group II-VI compound semiconductor crystal of CdTe, CdMnTe, CdZnTe, HgCdTe, ZnSe or ZnSSe.

2. Description of the Background Art

Typical conventional methods of preparing compound semiconductor bulk crystals are a horizontal Bridgman method, a gradient freezing method, a vertical Bridgman method, and a vertical gradient freezing method. In order to grow a single crystal by any of these methods, a seed crystal is first arranged on an end of a boat or a crucible and brought into contact with a raw material melt, and the temperature is gradually reduced from the seed crystal side to grow a single crystal. In such a method, however, the crystal is grown while it is in contact with the container wall, and hence crystal defects are disadvantageously caused due to wetting of the container wall by the melt.

It has generally been known in the art that crystal defects are caused in wet areas where the melt wets the container wall, to result in polycrystallization. In order to solve this problem, the following countermeasure has been generally considered.

A boat or a crucible is generally made of quartz or PBN (pyrolytic boron nitride). It is known to be possible to reduce the wettability of a quartz boat or crucible by roughening its surface by sandblasting. On the other hand, it is known to be possible to prevent wetting of a PBN crucible by covering its inner surface with boron oxide ($B_2O_3$) which is introduced therein with the raw material for the melt, for example.

FIG. 5 is a sectional view showing an exemplary apparatus for preparing a GaAs single crystal by the vertical Bridgman method.

Referring to FIG. 5, this apparatus comprises a stainless chamber 1, a heat insulator 2 arranged along the wall surface of the chamber 1, heaters 3 to 12 arranged in the interior of the chamber 1, and a quartz ampoule 14 supported by a lower shaft 13 arranged in the center of the chamber 1. An arsenic pressure control part 15 is provided on a lower end of the ampoule 14 for controlling the temperature of this portion, thereby controlling the arsenic partial pressure in the ampoule 14. The arsenic partial pressure is controlled with solid arsenic 16.

In the apparatus having the aforementioned structure, a GaAs crystal is prepared in the following manner.

First, a crucible 17 is arranged in an upper portion of the ampoule 14. The lower portion of the crucible 17 is in the form of an inverted cone, and a seed crystal 18 is mounted on its lower end. Then, GaAs raw material 19 and $B_2O_3$ 20 are charged into the crucible 17 on the seed crystal 18. Thereafter the ampoule 14 is sealed, and heated by the heaters 3 to 12. In this heating, the $B_2O_3$ 20 is first softened to cover the inner surface of the crucible 17. Thereafter the temperature is further increased to melt the GaAs raw material 19, and the temperature distribution is optimized, whereupon the lower shaft 13 is thereafter moved downwardly to move the ampoule 14 toward a lower temperature side, whereby the melted raw material 19 is solidified from the seed crystal 18 side, thereby growing a single crystal.

The vertical gradient freezing method is carried out substantially similarly to the vertical Bridgman method shown in FIG. 5, except that the vertical position of the ampoule 14 is fixed, i.e. maintained unchanged, and instead the outputs of the heaters 3 to 12 are varied to gradually upwardly move the lower temperature zone so that the melted raw material 19 held in the ampoule 14 is solidified from the seed crystal 18 side for growing a single crystal.

When the vertical Bridgman method or the vertical gradient freezing method is employed, it is possible to alternatively grow a crystal in the atmosphere, without employing the stainless chamber 1. In this case, the heat insulator 2, the heaters 3 to 12 and the like must be embodied to be employable in the atmosphere.

In the aforementioned conventional method, however, it is not necessarily possible to completely cover the inner surface of the crucible with $B_2O_3$, although the raw material 19 and the $B_2O_3$ material 20 are introduced into the crucible together and the ampoule is sealed and heated so that $B_2O_3$ is softened and flows to cover the inner surface of the crucible. To this end, Japanese Patent Laying-Open No. 62-176998 (1987) proposes a method of previously spreading boron oxide powder or boric acid powder on an inner surface of a PBN boat. Furthermore, Japanese Patent Laying-Open No. 62-176998 and U.S. Pat. No. 4,923,561 each propose a method that involves previously heating a PBN boat or a BN crucible in an oxygen atmosphere and oxidizing the same, thereby forming a $B_2O_3$ coating on the inner surface of the boat or the crucible, and thereafter introducing raw material into the boat or crucible for growing a crystal. According to this method, the inner surface of the boat or the crucible is previously covered with $B_2O_3$, whereby it is conceivably possible to attain a higher effect of preventing polycrystallization caused by wetting, as compared with the conventional method of charging $B_2O_3$ into the crucible together with the raw material. However, the aforementioned methods have the following problems respectively.

On the one hand, the method of previously spreading boron oxide powder or boric acid powder on the inner surface of a PBN boat or crucible has the following problems.

First, it is scarcely possible to attain adhesion of the boron oxide powder or the boric acid powder to the inner surface of the crucible by simply spreading the same. Therefore, the powder is disadvantageously easily separated from the crucible surface through contact with the raw material as it is introduced. Consequently, it is extremely difficult to homogeneously form a $B_2O_3$ film.

Second, the boron oxide powder or the boric acid powder has a high water content, and water-containing $B_2O_3$ is extremely easy to scatter. Therefore, this $B_2O_3$ is scattered before melting of the raw material, which thereby disrupts the film and exposes the inner surface of the crucible. Consequently, it is extremely difficult to obtain a homogeneous film since $B_2O_3$ is remarkably scattered particularly under a vacuum.

On the other hand, the method of previously heating a PBN boat or a BN crucible in an oxygen atmosphere to oxidize the boat or crucible and form forming a $B_2O_3$ coat on the inner surface thereof has the following problems.

First, it is generally necessary to form a thick $B_2O_3$ film of about 50 μm, in order to effectively prevent polycrystallization caused by wetting. Due to the formation of such a thick $B_2O_3$ film by oxidizing the crucible itself, therefore, the thickness of the crucible is remarkably reduced and hence its life is extremely reduced.

Second, it is necessary to heat the inner surface of the crucible, which is made of PBN having a dense structure, for a long time in order to oxidize the same, and hence the preparation cost is inevitably increased.

Third, it is difficult to maintain a homogeneous flow of oxygen gas although the thickness of the $B_2O_3$ depends on this flow. Moreoever, the viscosity of the $B_2O_3$ is reduced due to the high temperature heating, whereby the $B_2O_3$ tends to collect in the lower portion of the crucible. Thus, it is extremely difficult to form a homogeneous $B_2O_3$ film.

SUMMARY OF THE INVENTION

An object of the present invention is to provide a method of and a crucible for preparing a crystal, which can solve the aforementioned problems by completely preventing wetting of a crucible by a raw material melt and thus suppressing polycrystallization, for preparing a compound semiconductor single crystal with an excellent yield.

One aspect of the present invention provides a method of preparing a compound semiconductor crystal. This method comprises the steps of previously forming a boron or oxygen-free boron compound containing layer on an inner surface of a crucible, heat treating the crucible which has been provided with the boron or boron compound containing layer under an oxygen-containing atmosphere, e.g. an oxygen gas or oxygen mixed gas atmosphere, thereby forming a boron oxide containing layer at least on a surface of the boron or boron compound containing layer, then charging raw material into the crucible which has been provided with the boron oxide containing layer, melting the raw material for forming a melt, and solidifying the melt from an end of the crucible thereby growing a crystal.

The oxygen-free boron compound is preferably prepared from boron nitride, for example.

In the oxygen mixed gas, an additional gas to be mixed with oxygen is preferably a gas that hardly reacts with oxygen and has a small solubility with respect to $B_2O_3$, which is inactive with respect to the grown crystal. In more concrete terms, the oxygen mixed gas is preferably a mixed gas consisting of nitrogen gas or argon gas and oxygen gas, or air. A mixed gas consisting of helium gas, neon gas, krypton gas, xenon gas or carbon dioxide gas and oxygen gas can be employed.

Further, the heat treatment is carried out at a temperature in the range of 700° C. to 1800° C., preferably in the range of 800° C. to 1500° C., more preferably in the range of 900° C. to 1300° C.

Sputtering or vacuum deposition can be employed as a method of forming a boron nitride containing layer on the inner surface of the crucible. More preferably, a mixture of boron nitride powder and a solvent such as water, alcohol or acetone may be sprayed with gas such as butane gas, nitrogen gas, carbon dioxide gas or air, to form the boron nitride containing layer.

More preferably, a mixture of boron nitride powder and a solvent such as water, alcohol or acetone may be sprayed by hand or through an automatic atomizer, or brushed, to form the boron nitride containing layer.

More preferably, a mixed solution of boron nitride powder and a solvent such as water, alcohol or acetone may be charged into the crucible and thereafter the residual mixed solution is discharged, thereby forming the boron nitride containing layer on the inner surface of the crucible.

When the boron or boron compound containing layer is heat treated under the oxygen gas or oxygen mixed gas atmosphere, the crucible may be screened with a shielding material at areas other than the region provided with the boron oxide containing layer. This is because the crystal as grown in the crucible will be strongly adhered to the crucible by boron oxide ($B_2O_3$) and cannot be detached from the same and hence the amount of the boron oxide as formed is preferably minimized. In other words, it is preferable to minimize the area of the $B_2O_3$ layer which is formed on the inner surface of the crucible, while it is most preferable to form the boron oxide containing layer to be limited only to the portion of the inner surface of the crucible for growing the crystal.

Another aspect of the present invention provides another method of preparing a compound semiconductor crystal. This method comprises the steps of previously forming an oxygen-containing boron compound containing layer on an inner surface of a crucible, heat treating the crucible which has been provided with the boron compound containing layer thereby forming a boron oxide containing layer at least on a surface of the boron compound containing layer, charging a raw material into the crucible which has been provided with the boron oxide containing layer, melting the raw material to form a melt, and solidifying the melt from an end of the crucible thereby growing a crystal.

The oxygen-containing boron compound is preferably prepared from orthoboric acid ($H_3BO_3$)), metaboric acid ($HBO_2$), tetraboric acid ($H_2B_4O_7$) or boron oxide ($B_2O_3$), for example. When such an oxygen-containing boron compound is employed, it is not necessary to add oxygen to the atmosphere gas for the heat treatment.

The heat treatment is carried out at a temperature in the range of 300° C. to 1800° C., preferably in the range of 350° C. to 1500° C., and more preferably in the range of 400° C. to 1300° C.

After the boron oxide containing layer is formed by the heat treatment, an additional step may be carried out to again increase the temperature to a level in the range of 1000° C. to 1800° C., for adjusting the water content of boron oxide to not more than 0.5 percent by weight.

The oxygen-containing boron compound containing layer may be formed on the inner surface of the crucible by dissolving or mixing the oxygen-containing boron compound in or with a solvent such as water, alcohol such as methyl alcohol, ethyl alcohol, propyl alcohol or butyl alcohol, or acetone, and applying or spraying the resulting solution onto the inner surface of the crucible.

Alternatively, a solution or a mixed solution of the oxygen-containing boron compound may be charged into the crucible and thereafter the residual solution or mixed solution is discharged, thereby forming the oxygen-containing boron compound containing layer on the inner surface of the crucible.

Further, a solid source of the oxygen-containing boron compound may be sputtered with argon or the like, or irradiated with an electron beam, so that the oxygen-containing boron compound containing layer is formed on the inner surface of the crucible.

In addition, a powder of the oxygen-containing boron compound may be charged into the crucible and then the residual powder is removed after the heat treatment, thereby forming the oxygen-containing boron compound containing layer on the inner surface of the crucible.

According to the present invention, the boron oxide concentration in the boron oxide containing layer that is formed on the inner surface of the crucible by the heat treatment may be not less than 30 percent by weight, preferably not less than 40 percent by weight, and more preferably not less than 50 percent by weight, in order to effectively prevent wetting of the crystal and the crucible.

According to the present invention, on the other hand, the boron oxide concentration is preferably minimized in a portion of the layer that is in contact with the crucible. This is because boron oxide ($B_2O_3$) is solidified after the crystal growth, which damages the inner surface of the crucible by strongly adhering thereto. For example, the life of a PBN crucible is reduced because its surface layer is disadvantageously delaminated. When the boron oxide concentration is reduced in the portion of the layer that is in contact with the crucible, therefore, it is possible to reduce the adhesion of the layer onto the crucible and reduce the resulting damage of the crucible and increase its life. In more concrete terms, the boron oxide concentration in the portion of the layer that is in contact with the crucible may be not more than 70 percent by weight, preferably not more than 60 percent by weight, and more preferably not more than 50 percent by weight, so that it is possible to reduce damage of the crucible caused by strong adhesion of boron oxide.

Moreoever, it should be understood that the boron oxide concentration is reduced in the portion of the layer that is in contact with the crucible as compared to the portion of the layer forming the exposed surface facing the melt. In other words, a boron oxide concentration gradient or a plurality of layers with different oxide concentrations are provided, as explained below. In this manner it is possible to effectively prevent wetting of the crystal and the crucible and simultaneously to reduce damage of the crucible caused by strong adhesion of boron oxide.

According to the inventive method, it is possible to freely adjust the compounding ratio of $B_2O_3$ by adjusting the degree of oxidization and the content of the boron compound.

While it is possible to adjust the $B_2O_3$ concentration by controlling the temperature and the time for oxidization, this can also be achieved by introducing a layer having higher density than the surface into the boron or boron compound containing layer which is formed on the inner surface of the crucible. This is because oxidation hardly progresses inwardly beyond the high density layer, and hence it is possible to readily reduce the boron oxide concentration in the portion of the layer which is in contact with the crucible as compared with the portion of the layer on the surface.

As to a method of adjusting the boron oxide concentration, it is also effective to further mix at least one substance selected from the group consisting of a group III element, a group IV element, a group V element, and respective compounds thereof, into the boron or boron compound containing layer.

The group III element is preferably Al, for example, while the compound of the group III element is preferably an Al compound, i.e., an Al oxide or an Al nitride in more concrete terms, for example.

Further, the group III element can also preferably be Ga, and the compound of the group III element can also preferably be a Ga compound, i.e., a Ga oxide or a Ga nitride in more concrete terms, for example.

The group IV element is preferably Si, for example, while the compound of the group IV element is preferably a Si compound, i.e., a silicon oxide, silicon nitride or silicon carbide in more concrete terms, for example.

Further, it is possible to effectively form the boron oxide containing layer on the surface by reducing the concentration of the Al or the Al compound, the Ga or the Ga compound or the Si or the Si compound on the surface of the boron or boron compound containing layer that is formed on the inner surface of the crucible as compared with the interior of the layer, and correspondingly increasing the content of boron or the boron compound on the surface.

According to the present invention, the boron oxide containing layer is preferably to be formed only on a portion of the crucible which is to be in contact with the raw material melt.

After the boron oxide containing layer is formed on the inner surface of the crucible, the crucible is cooled to room temperature in a reduced pressure or dry gas atmosphere.

According to the present invention, further, the crucible is preferably cooled to room temperature in the reduced pressure or dry gas atmosphere, so that the water concentration of the boron oxide containing layer as formed is not more than 0.5 percent by weight, preferably in the range of 0.001 to 0.1 percent by weight, and more preferably in the range of 0.001 to 0.02 percent by weight. This is because boron oxide is scattered with water at a high temperature, which thereby damages the homogeneity of the film, if the water concentration of the boron oxide containing layer exceeds 0.5 percent by weight. In particular, a thin film of $B_2O_3$ readily absorbs water due to its large specific surface area. After formation of the $B_2O_3$ containing layer, therefore, it is preferable to prevent the $B_2O_3$ containing layer from absorbing water by cooling the crucible to room temperature under the reduced pressure or dry gas atmosphere.

According to the present invention, it is necessary to carry out a heat treatment at a high temperature in order to obtain a $B_2O_3$ film having low water concentration. However, the thickness of the $B_2O_3$ film is readily heterogenized as the temperature is increased, because at high temperatures $B_2O_3$ will flow down toward the lower portion of the crucible due to reduction of its viscosity. Therefore, it is preferable to carry out the process of forming the $B_2O_3$ film by heat treating boron or the boron compound at a relatively low temperature of not more than 1000° C. over a considerably long time, while adjusting the water concentration of the film at a high temperature of not less than 1000° C. in a short time. Due to such a two-step heat treatment, it is possible to form a homogeneous $B_2O_3$ film with a low water content.

The inventive method is applicable to any method such as the horizontal Bridgman method, the vertical Bridgman method, the horizontal gradient freezing method and the vertical gradient freezing method, as long as the method is adapted to prepare a compound semiconductor crystal by solidifying the melt from an end of the crucible. Further, the shape of the crucible as employed is not limited either, and any shape is employable as long as the crucible or a boat is applied to the aforementioned method of preparing a compound semiconductor crystal. Further, the heating means for carrying out the heat treatment is not restricted to an annular furnace but any means is employable as long as it can heat the crucible to a target temperature.

Still another aspect of the present invention provides a crucible for preparing a compound semiconductor crystal.

This crucible is adapted to prepare a compound semiconductor crystal by melt solidification, and is characterized in that it has on its inner surface a boron oxide containing layer having a water concentration of not more than 0.5 percent by weight, preferably in the range of 0.001 percent by weight to 0.1 percent by weight, and more preferably in the range of 0.001 percent by weight to 0.02 percent by weight.

The material for the crucible can be boron nitride, graphite, pyrolytic boron nitride (PBN), pyrolytic graphite (PG), glassy carbon, alumina, zirconia, silicon nitride, silicon carbide or quartz, for example.

As hereinabove described, the present invention is adapted to prepare a compound semiconductor crystal not by spreading boron oxide powder or boric acid powder onto an inner surface of a crucible or oxidizing a PBN boat or a BN crucible itself, but rather by forming a boron or boron compound containing layer on an inner surface of a crucible and heat treating the same so as to form a $B_2O_3$ layer. Dissimilarly to the conventional method of growing a crystal by introducing a raw material and solid $B_2O_3$ into a crucible, therefore, it is possible to form a homogeneous $B_2O_3$ film on the inner surface of the crucible prior to changing the raw material, while assuring that the $B_2O_3$ film does not form an incomplete or heterogeneous coating. Thus, it is possible to prevent the raw material melt from wetting the container and to prevent the possibility of polycrystallization.

When a boron or oxygen-free boron compound containing layer is formed in the present invention, it is possible to form a $B_2O_3$ containing film on the inner surface of the crucible by heating the same in an oxygen-containing gas atmosphere. For example, a $B_2O_3$ film is formed by oxidizing boron nitride, according to the following chemical reaction formula (A):

$$4BN+3O_2 \rightarrow 2B_2O_3+2N_2 \qquad \ldots (A)$$

When an oxygen-containing boron compound containing layer is formed in the present invention, further, oxygen is not necessary in the treatment atmosphere but a $B_2O_3$ film can be formed on the inner surface of the crucible by thermal decomposition. For example, a $B_2O_3$ film is formed by thermal decomposition of orthoboric acid ($H_3BO_3$)), according to the following chemical reaction formula (B):

$$2H_3BO_3 \rightarrow B_2O_3+3H_2O \qquad \ldots (B)$$

On the other hand, it is impossible to attain adhesion of the power onto the crucible by merely applying a boron compound containing powder that has been mixed with a solvent. In this case, the film of the powder as applied is disadvantageously stripped when the raw material is charged into or held in the crucible. According to the present invention, therefore, $B_2O_3$ which is formed by the reaction of the formula (A) or (B) is softened at a temperature of not less than 300° C. by the heat treatment, so that the particles thereof adhere to the crucible wall. Consequently, it is possible to obtain a $B_2O_3$ film having high adhesion, which is not stripped when the raw material is charged into or held in the crucible.

The foregoing and other objects, features, aspects and advantages of the present invention will become more apparent from the following detailed description of the present invention when taken in conjunction with the accompanying drawings.

DETAILED DESCRIPTION OF PREFERRED EXAMPLE EMBODIMENTS AND OF THE BEST MODE OF THE INVENTION

Figure 1:
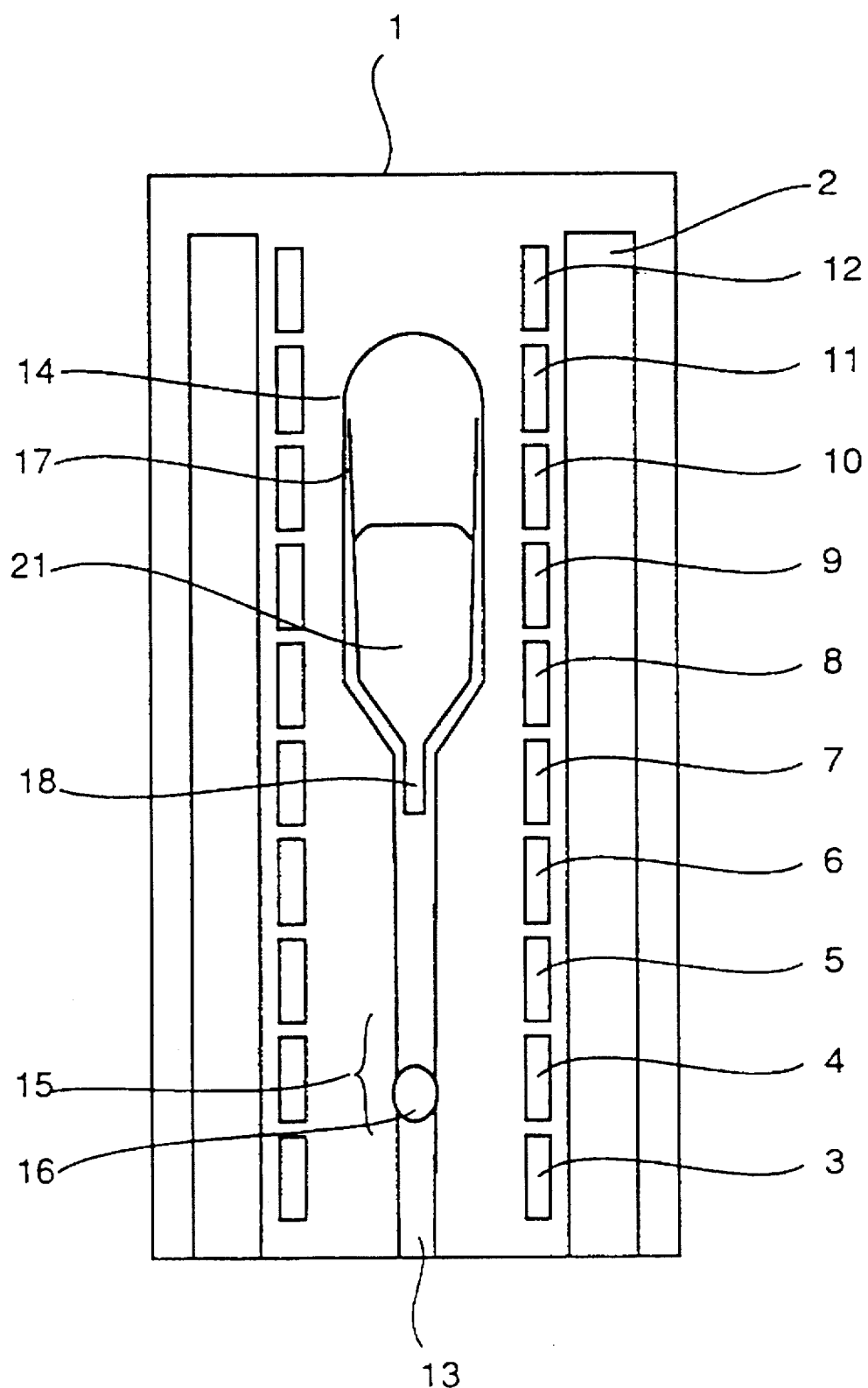
FIG. 1 is a conceptual diagram of an apparatus for preparing a crystal, which is employed for carrying out the inventive method.
Figure 5:
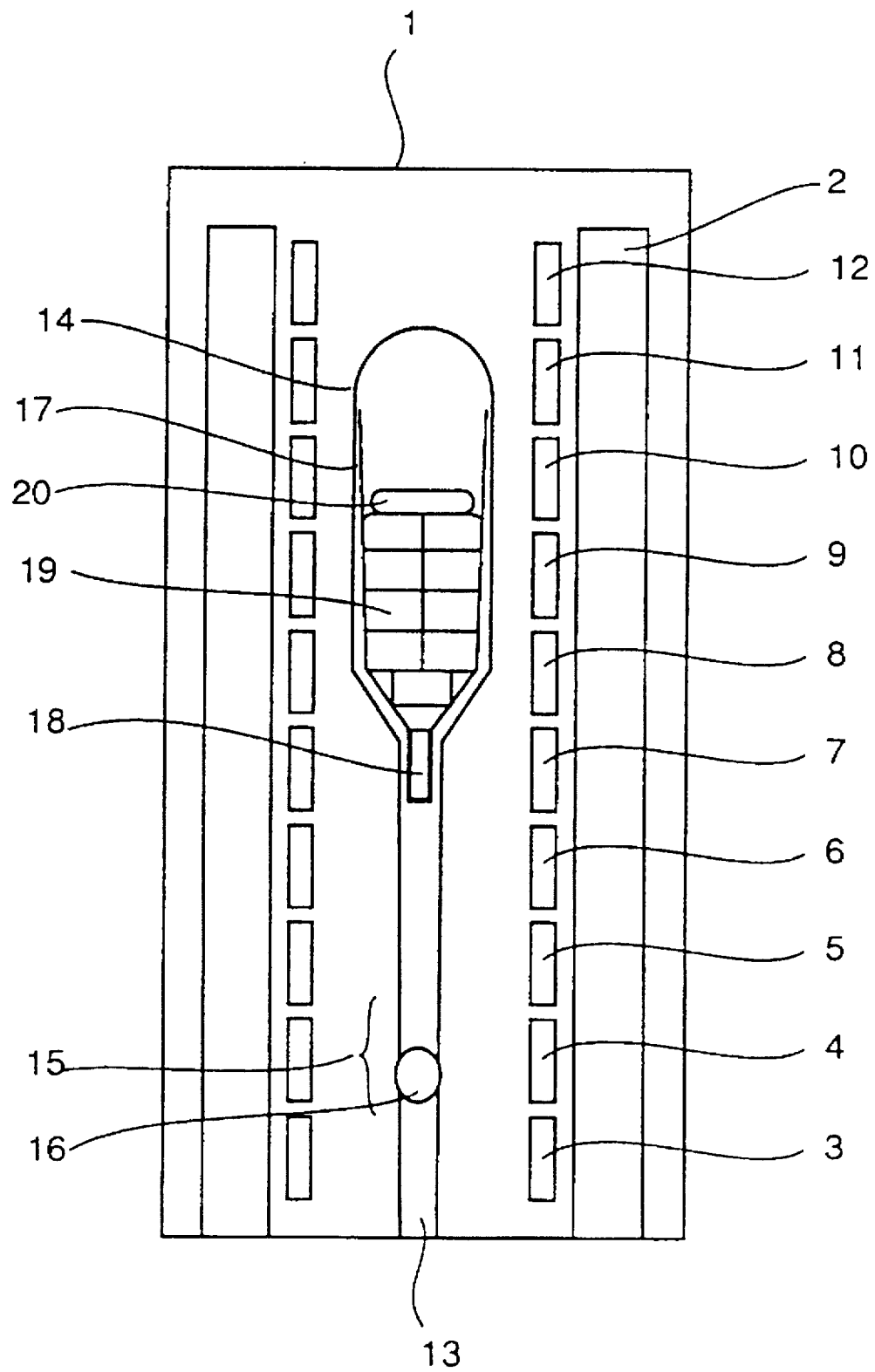
FIG. 5 is a conceptual diagram of a conventional apparatus for preparing a crystal.

FIG. 1 is a conceptual diagram of an apparatus for preparing a crystal, which is employed for carrying out the method according to the present invention. This apparatus is similar to the conventional apparatus shown in FIG. 5, except the apparatus of FIG. 1 uses a crucible that has been provided with a $B_2O_3$ containing layer according to the inventive method. Thus, redundant description of FIG. 5 that also applies to FIG. 1 is omitted. In contrast to the apparatus shown in FIG. 5, the apparatus of FIG. 1 is not charged with a crystal forming raw material 19 and $B_2O_3$ material 20, but rather only with a raw material that forms a raw material melt that ultimately forms the single crystal 21. The $B_2O_3$ charging material 20 is omitted due to the special preparation of the crucible 17, as described next.

Figure 2:
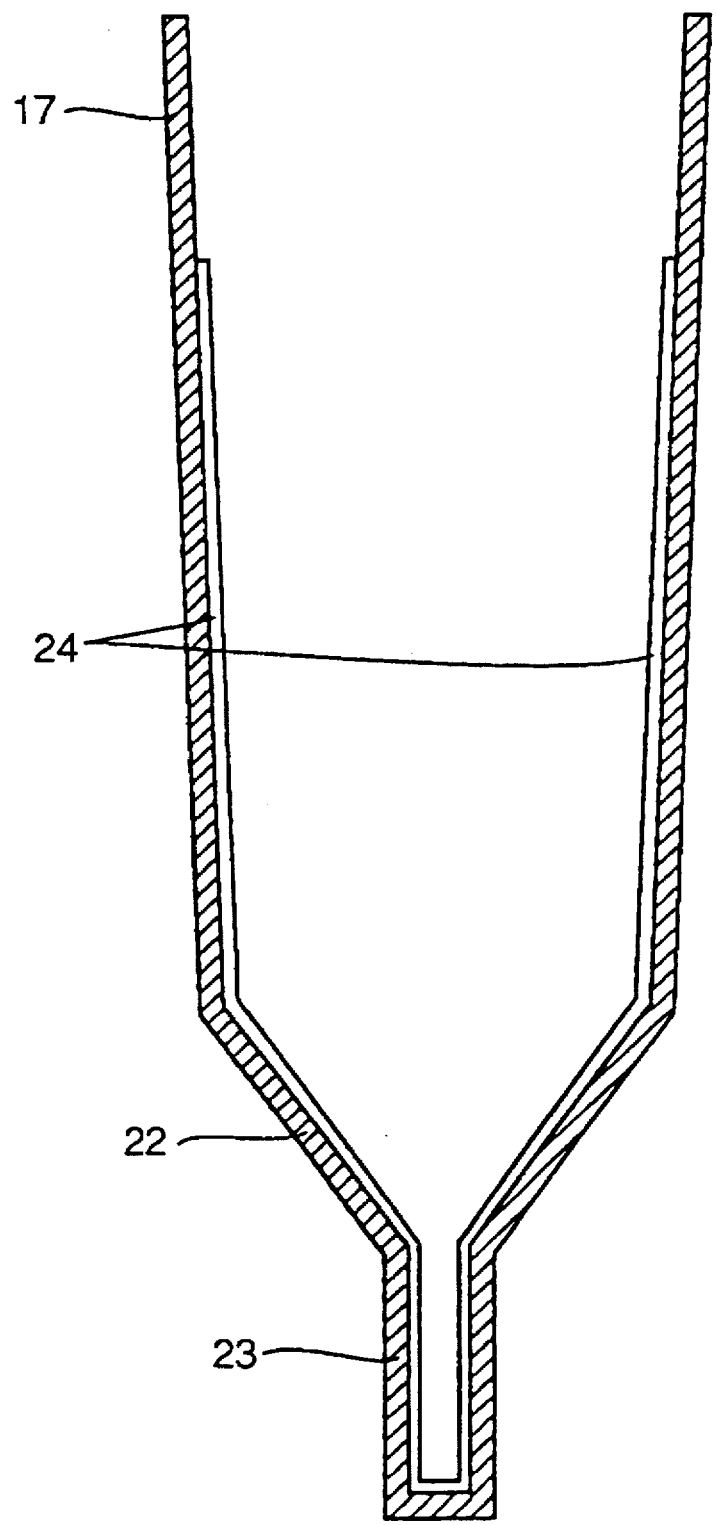
FIG. 2 is an enlarged view showing the crucible employed in FIG. 1, which is provided on its inner surface with a boron or boron compound containing film.
Figure 3:
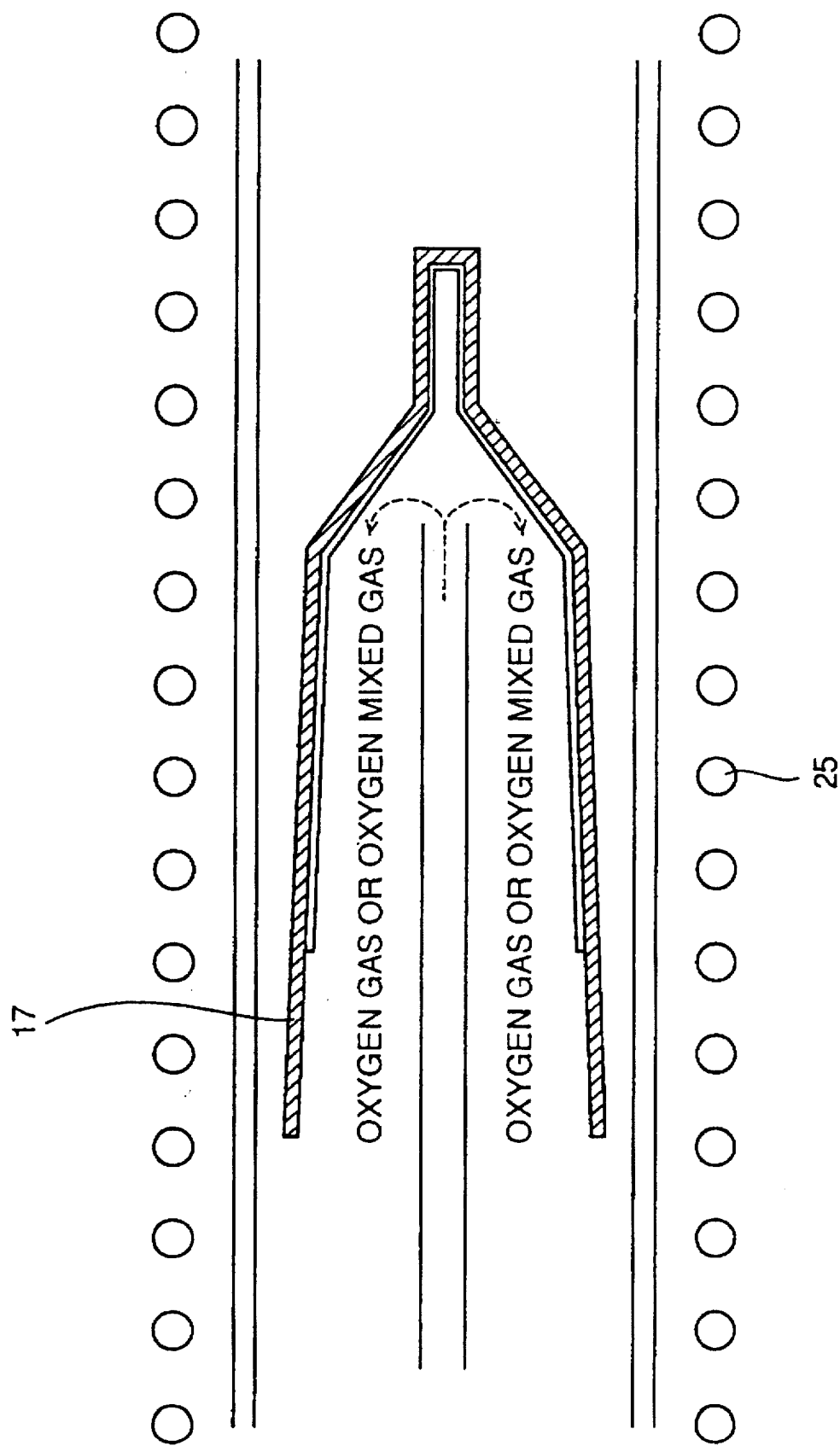
FIG. 3 illustrates an exemplary situation of heat treating a boron or boron compound containing layer that has been provided on an inner surface of a crucible.

FIG. 2 is an enlarged view showing a crucible 17 that is employed in the apparatus shown in FIG. 1. The crucible 17 has been provided on its inner surface with a boron or boron compound containing film, and FIG. 3 is a schematic drawing illustrating an exemplary situation of heat treating the boron or boron compound containing layer that has been formed on the inner surface of the crucible 17.

As shown in FIG. 2, the exemplary crucible 17 employed in the present invention has a seed crystal holding part 23 at its lower end, and consists of a tapered part 22 and side walls continuous thereto, while a boron or boron compound containing film 24 has been formed on at least a wall surface that will come into contact with the raw material melt 21. The crucible 17 shown in FIG. 2 is introduced into an annular furnace 25 shown in FIG. 3 and heat treated while feeding oxygen or oxygen-containing gas, so as to form a $B_2O_3$ containing film on its inner surface.

Figure 4:
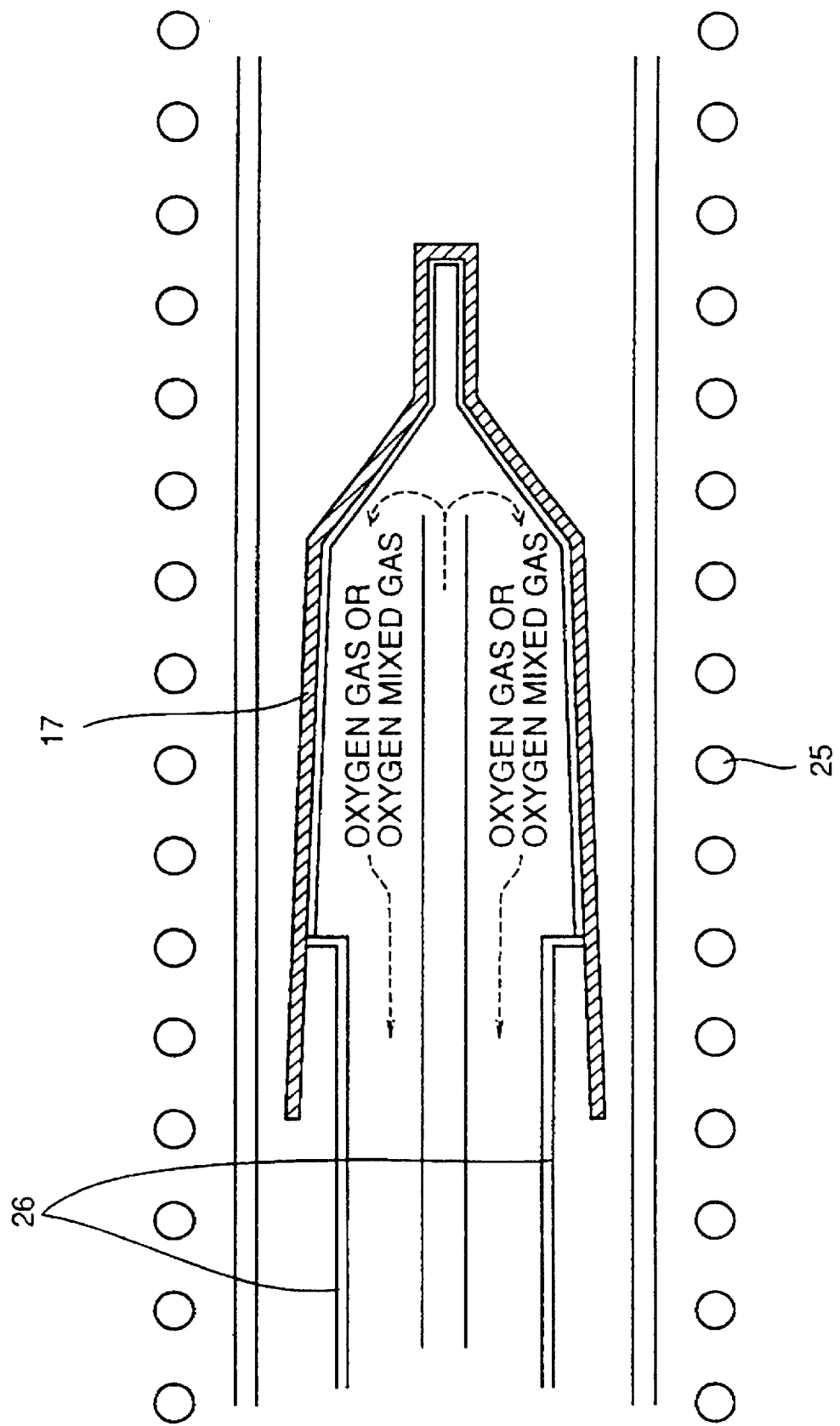
FIG. 4 illustrates another exemplary situation of heat treating a boron or boron compound containing layer that has been provided on an inner surface of a crucible.

FIG. 4 is a diagram illustrating another exemplary situation of heat treating the boron or boron compound containing layer which has been provided on the inner surface of the crucible 17. When the heat treatment is carried out in the annular furnace 25 shown in FIG. 4, an inner surface portion of the crucible 17 that is not to be provided with the $B_2O_3$ containing film is covered or shielded from the oxygen containing gas with a shielding material 26, for limiting the region to be provided with the $B_2O_3$ containing film.

Several examples which were carried out using such an apparatus will now be described for investigating the effects of the present invention.

EXAMPLE 1

As shown in FIG. 2, a PBN crucible about 80 mm in diameter and about 300 mm in height, and having a tapered part and a seed crystal holding part on its lower portion end, was employed. A boron nitride containing layer was formed on the crucibles inner surface by spraying with boron nitride powder, alcohol and carbon dioxide gas. Thereafter this crucible was introduced into an annular furnace, and was heat treated at 1000° C. for 5 hours while feeding oxygen gas at a flow rate of 1 l/min., thereby forming a $B_2O_3$ film having a thickness of about 50 µm on its inner surface. Thereafter the crucible was cooled to room temperature at a cooling rate of 10° C./min., while feeding oxygen gas.

The water concentration of the $B_2O_3$ film obtained in the aforementioned manner was 0.02 percent by weight. Further, the thickness of this $B_2O_3$ film was extremely homogeneous, with a dispersion of not more than ±5 µm.

Then, 3 kg of GaAs polycrystalline raw material and a dopant of solid Si were placed onto the crucible, which had been provided with the $B_2O_3$ film on its inner surface, and the crucible was vacuum-sealed in a longitudinal quartz ampoule 14 having an arsenic pressure control part 15 as shown in FIG. 1. Then, the raw material in the crucible was melted, and thereafter the temperature was reduced starting from the seed crystal side while controlling the arsenic pressure in the ampoule 14, thereby growing Si-doped n-type GaAs single crystals.

As a result, absolutely no polycrystallization caused by wetting was recognized in the growth of 20 single crystals.

EXAMPLE 2

A solution was prepared by dissolving orthoboric acid in methyl alcohol to attain saturation concentration and then applied, using an atomizer onto an inner surface of a PBN crucible having the same shape as that in Example 1. Then, the methyl alcohol contained in the solution was quickly dried with dry nitrogen gas. The application and drying steps were repeated to form an orthoboric acid film having a thickness of about 100 µm. This crucible was introduced into an annular furnace, and was heat treated at 800° C. for about 2 hours while feeding nitrogen gas at a flow rate of 1 l/min., thereby forming a $B_2O_3$ film having a thickness of about 50 µm on its inner surface. Then, the crucible was heated up to 1100° C. and held for 1 hour for adjusting the water concentration of the $B_2O_3$ film to 0.01 percent by weight, and thereafter cooled to room temperature at a cooling rate of 10° C./min.

The thickness of the $B_2O_3$ film that was formed on the inner surface of the crucible in the aforementioned manner was extremely homogeneous, with a dispersion of not more than ±5 µm.

Then, this crucible was employed to grow Si-doped n-type GaAs single crystals, similarly to Example 1.

As a result, absolutely no polycrystallization caused by wetting was recognized in the growth of 20 single crystals.

EXAMPLE 3

$B_2O_3$ powder was charged into a PBN crucible having the same shape as that in Example 1. The crucible was filled with the powder to a level or height that was 15 mm higher than a crystal to be grown subsequently in the crucible. Then, this crucible was introduced into a vertical heating furnace and heated to about 400° C., so that $B_2O_3$ adhered to its inner surface as a layer with a thickness of about 100 µm.

Then, the crucible was introduced into a high-temperature heating furnace, and was heat treated at 1100° C. for 30 minutes while feeding dry argon gas, thereby forming a $B_2O_3$ film having a thickness of 50±5 µm, and a water concentration adjusted to 0.01 percent by weight. Thereafter this crucible was cooled to room temperature at a cooling rate of 5° C./min.

Then, this crucible was employed to grow Si-doped n-type GaAs single crystals, similarly to Example 1.

As a result, absolutely no polycrystallization caused by wetting was recognized in the growth of 20 single crystals.

EXAMPLE 4

A PBN crucible having the same shape as that in Example 1 was fixed into a deposition apparatus with its opening directed downwardly, and a boron nitride tablet 20 m in diameter and 15 mm in thickness was set on a water-cooled holder. The deposition apparatus was sealed and evacuated, and the boron nitride tablet was thereafter irradiated with an electron beam to deposit a boron nitride film having a thickness of 60 µm adhering onto the inner surface of the crucible. Thereafter the crucible was heat treated at 1000° C. for 10 hours while feeding oxygen gas, thereby forming a $B_2O_3$ film having a thickness of 50±5 µm. Thereafter the crucible was cooled to room temperature at a cooling rate of 10° C./min, while feeding dry nitrogen gas.

The crucible obtained in the aforementioned manner was employed to grow Si-doped n-type GaAs single crystals, similarly to Example 1.

As a result, absolutely no polycrystallization caused by wetting was recognized in the growth of 20 single crystals.

EXAMPLE 5

A mixed solution of acetone and boron nitride powder was introduced into a PBN crucible having the same shape as that in Example 1 to form a high density boron nitride film having a thickness of about 25 µm on the inner surface of the crucible, and thereafter the residual mixed solution was discharged. Further, the same mixed solution of acetone and boron nitride powder was applied onto the high density boron nitride film with an atomizer, to form a low density boron nitride film having a thickness of about 50µm. The crucible as obtained was heat treated in an annular furnace at 1000° C. for about 2 hours while feeding of mixed gas containing 50 percent of oxygen and 50 percent a argon at a flow rate of 1 l/min., thereby forming a $B_2O_3$ containing film having a thickness of about 50 µm.

The thickness of the $B_2O_3$ containing film as obtained was extremely homogeneous, with a dispersion of ±5 µm. Further, the $B_2O_3$ content of the $B_2O_3$ containing film which was formed in the aforementioned manner was 80 percent by weight on the film surface, and 40 percent by weight in a portion which was in contact with the crucible.

Then, the crucible obtained in the aforementioned manner was employed to grow Si-doped n-type GaAs single crystals, similarly to Example 1.

As a result, absolutely no polycrystallization caused by wetting was recognized in the growth of 20 single crystals. Further, it was easy to remove the $B_2O_3$ containing film, whereby the life of the PBN crucible was substantially doubled, with only minimal damage being caused by removing the film.

EXAMPLE 6

A solution was prepared by mixing boron nitride powder with $SiO_2$ powder serving as a source of silicon oxide in the weight ratio of 1:3 ($BN:SiO_2=1:3$), and further mixing acetone into this powder mixture. Then solution was then applied to an inner surface of a PBN crucible having the same shape as that in Example 1 with an atomizer, to form a film containing boron nitride and $SiO_2$, and having a thickness of about 40 µm. Further, another solution was prepared by mixing boron nitride powder with $SiO_2$ powder serving as a source of silicon oxide in the weight ratio of 3:2 ($BN:SiO_2$=3:2) and further mixing acetone into this powder mixture. The second solution was applied onto the previously formed first film with an atomizer, and the crucible was heat treated in an annular furnace at 1000° C. for 5 hours while feeding oxygen gas at a flow rate of 1 l/min., thereby forming a $B_2O_3$ containing film having a thickness of about 50 μm.

The thickness of the film containing $B_2O_3$ as obtained was extremely homogeneous, with a dispersion of not more than ±5 μm. Further, the $B_2O_3$ content of the $B_2O_3$ containing film which was formed in the aforementioned manner was 70 percent by weight on the film surface, and 30 percent by weight in a portion that was in contact with the crucible.

Then, the crucible obtained in the aforementioned manner was employed to grow Si-doped n-type GaAs single crystals, similarly to Example 1.

As a result, absolutely no polycrystallization caused by wetting was recognized in the growth of 20 single crystals. In addition, it was easy to remove the $B_2O_3$ containing film, whereby the life of the PBN crucible was substantially doubled, with only minimal damage being caused by removing the film.

EXAMPLE 7

A solution was prepared by mixing boron oxide powder with $Al_2O_3$ powder in the weight ratio of 2:8 ($B_2O_3:Al_2O_3$=2:8) and further mixing acetone into this powder mixture. This solution was applied to an inner surface of a PBN crucible having the same shape as that in Example 1 with an atomizer, to form a film containing boron nitride and $Al_2O_3$ having a thickness of about 40 μm. Further, another solution was prepared by mixing boron oxide powder with $Al_2O_3$ powder in the weight ratio of 9:1 ($B_2O_3:Al_2O_3$=9:1) and further mixing acetone into this powder mixture. This second solution was applied onto the previously formed first film with an atomizer, and the crucible was heat treated in an annular furnace at 1000° C. for 5 hours while feeding oxygen gas at a flow rate of 1 l/min., thereby forming a $B_2O_3$ containing film having a thickness of about 50 μm.

The thickness of the film containing $B_2O_3$ as obtained was extremely homogeneous, with a dispersion of not more than ±5 μm. Further, the $B_2O_3$ content of the $B_2O_3$ containing film which was formed in the aforementioned manner was 90 percent by weight on the film surface, and 20 percent by weight in a portion that was in contact with the crucible.

Then, the crucible obtained in the aforementioned manner was employed to grow Si-doped n-type GaAs single crystals, similarly to Example 1.

As a result, absolutely no polycrystallization caused by wetting was recognized in the growth of 20 single crystals. Further, it was easy to remove the $B_2O_3$ containing film, whereby the life of the PBN crucible was substantially doubled, with only minimal damage in removal of the film.

COMPARATIVE EXAMPLE 1

A PBN crucible having the same shape as that in Example 1 was heat treated in an annular furnace at 1100° C. for 50 hours while feeding oxygen gas at a flow rate of 1 l/min., thereby forming a $B_2O_3$ film by oxidizing the inner surface of the crucible. While the average thickness of the $B_2O_3$ film as obtained was 50 μm, the thickness at a lower portion of the crucible was considerably greater, with maximum value of 200 μm. On the other hand, the thickness at an upper portion of the crucible was extremely small, with the value of substantially 0 μm. After formation of the $B_2O_3$ film, the crucible was not particularly held in a dry atmosphere, but cooled to the room temperature at a cooling rate of 2° C./min. As a result, the water concentration of the $B_2O_3$ film was at an extremely high level of 1 percent by weight.

The crucible that was obtained in the aforementioned manner was employed to grow Si-doped n-type GaAs single crystals, similarly to Example 1.

As a result, it was observed that polycrystallization was caused by wetting on the upper portion of the crucible having the relatively thin $B_2O_3$ film, in 16 samples among 20 single crystals that were grown.

It is clearly understood from the above description that the following effects can be attained according to the present invention:

(1) The life of the crucible can be increased since the crucible itself is not oxidized.

(2) The boron or boron compound containing layer adhering to the inner surface of the crucible has a sparse structure, whereby the $B_2O_3$ containing film can be formed in a short time at a relatively low temperature.

(3) The boron or boron compound containing layer adhering to the inner surface of the crucible has a sparse structure, whereby the oxidization progresses inwardly to facilitate the formation of a thick $B_2O_3$ containing film.

(4) Formation of the $B_2O_3$ containing film is not influenced by the state of flow of the oxygen gas and it is not necessary to apply a high temperature for increasing the film's thickness, whereby a homogeneous film can be readily formed.

(5) When the $B_2O_3$ containing film is prepared from the oxygen-containing boron compound, it is possible to form the film in an extremely short time at a low temperature.

(6) It is possible to reduce damage of the crucible caused by strong adhesion of $B_2O_3$ and to increase the crucible life by reducing the $B_2O_3$ concentration in a portion of the $B_2O_3$ containing film that is in contact with the crucible.

(7) By decreasing the water concentration of the $B_2O_3$ containing film, $B_2O_3$ is less likely to scatter, whereby a homogenous film can be formed.

(8) It is possible to increase the life of the crucible and to form the $B_2O_3$ containing film in a short time at a low temperature, whereby the cost can be reduced.

(9) The compound semiconductor crystal can be grown in the crucible comprising a homogenous $B_2O_3$ containing film, whereby a high single crystal yield can be attained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A crucible for preparing a compound semiconductor crystal by melt solidification therein, comprising a crucible body having an inner surface, and a boron oxide containing layer disposed on at least a portion of said inner surface, wherein boron oxide of said layer has a water concentration of not more than 0.5 percent by weight.

2. The crucible of claim 1, wherein said water concentration in said boron oxide is in the range from 0.001 to 0.1 percent by weight.

3. The crucible of claim 1, wherein said water concentration in said boron oxide is in the range from 0.001 to 0.02 percent by weight.

4. The crucible of claim 1, wherein said boron oxide containing layer further contains a material other than boron oxide.

5. The crucible of claim 4, wherein said boron oxide containing layer has an overall average boron oxide content of at least 50 percent by weight.

6. The crucible of claim 4, wherein said boron oxide containing layer has a gradient of boron oxide content with a greater boron oxide content at an exposed surface of said layer and a smaller boron oxide content at an interface of said layer on said inner surface of said crucible body.

7. The crucible of claim 6, wherein said greater boron oxide content is greater than 50 percent by weight and said smaller boron oxide content is less than 50 percent by weight.

8. The crucible of claim 6, wherein said greater boron oxide content is at least about 70 percent by weight and said smaller boron oxide content is not more than about 40 percent by weight.

9. The crucible of claim 6, wherein said gradient is a uniformly varying gradient.

10. The crucible of claim 6, wherein said boron oxide containing layer includes at least two sublayers and said gradient of boron oxide content includes a stepped transition of boron oxide content between said two sublayers.

11. The crucible of claim 4, wherein said material other than boron oxide in said boron oxide containing layer comprises a component selected from the group consisting of elements and compounds of elements of groups III, IV and V of the periodic table.

12. The crucible of claim 11, wherein said boron oxide containing layer has a gradient of boron oxide content with a greater boron oxide content at an exposed surface of said layer and a smaller boron oxide content at an interface of said layer on said inner surface of said crucible body, and has a gradient of said selected component that varies opposite said gradient of boron oxide content.

13. The crucible of claim 11, wherein said selected component is selected from the group consisting of Al, Ga, Si and compounds thereof.

14. The crucible of claim 4, wherein said boron oxide containing layer has a density gradient with a greater density at an interface of said layer on said inner surface of said crucible body and a smaller density at an exposed surface of said layer.

15. The crucible of claim 4, wherein said boron oxide containing layer comprises a distinct layer applied onto said inner surface of said crucible body and is not formed integrally in said crucible body.

16. The crucible of claim 4, wherein said crucible body contains no boron nitride.

17. The crucible of claim 4, wherein said inner surface of said crucible is not oxidized.

18. The crucible of claim 4, wherein said boron oxide containing layer is a continuous film layer.

19. The crucible of claim 4, wherein said boron oxide containing layer has a layer thickness that is uniform to within about ±5 μm over all of said layer.

20. The crucible of claim 19, wherein said layer thickness of said boron oxide containing layer is at least about 50 μm on average over all of said layer.

* * * * *

UNITED STATES PATENT AND TRADEMARK OFFICE
CERTIFICATE OF CORRECTION

PATENT NO. : 5,656,077
DATED : August 12, 1997
INVENTOR(S) : Kawase

It is certified that error appears in the above-indentified patent and that said Letters Patent is hereby corrected as shown below:

Col. 3, line 3, delete "forming".
Col. 7, line 46, replace "power" by --powder--.
Col. 9, line 27, after "and" insert --was--.
Col. 11, line 57, replace "in removal of" by --being caused by removing--.

Signed and Sealed this

Twenty-first Day of October 1997

BRUCE LEHMAN

Attest:

Attesting Officer

Commissioner of Patents and Trademarks